(12) United States Patent
Affinito

(10) Patent No.: US 8,084,102 B2
(45) Date of Patent: Dec. 27, 2011

(54) METHODS FOR CO-FLASH EVAPORATION OF POLYMERIZABLE MONOMERS AND NON-POLYMERIZABLE CARRIER SOLVENT/SALT MIXTURES/SOLUTIONS

(75) Inventor: John D. Affinito, Tucson, AZ (US)

(73) Assignee: Sion Power Corporation, Tucson, AZ (US)

( * ) Notice: Subject to any disclaimer, the term of this patent is extended or adjusted under 35 U.S.C. 154(b) by 1206 days.

(21) Appl. No.: 11/728,197

(22) Filed: Mar. 23, 2007

(65) Prior Publication Data

US 2008/0187663 A1    Aug. 7, 2008

Related U.S. Application Data

(60) Provisional application No. 60/899,735, filed on Feb. 6, 2007.

(51) Int. Cl.
    *C08F 2/46* (2006.01)
(52) U.S. Cl. ........ 427/488; 427/497; 427/508; 427/509; 427/562; 427/255.28; 427/255.6
(58) Field of Classification Search ................ 427/488, 427/497, 508, 509, 562, 255.28, 255.6; C23C 16/488
    See application file for complete search history.

(56) References Cited

U.S. PATENT DOCUMENTS

| | | | |
|---|---|---|---|
| 4,009,153 A | | 2/1977 | Shin |
| 4,842,893 A * | | 6/1989 | Yializis et al. ................ 427/497 |
| 4,954,371 A | | 9/1990 | Yializis |
| 5,260,095 A * | | 11/1993 | Affinito ........................ 427/124 |
| 5,681,615 A * | | 10/1997 | Affinito et al. ............. 427/255.6 |
| 5,902,641 A * | | 5/1999 | Affinito et al. ........... 427/255.32 |
| 6,045,864 A * | | 4/2000 | Lyons et al. .............. 427/255.23 |
| 6,140,598 A * | | 10/2000 | Schonert et al. ........... 209/127.1 |
| 6,245,150 B1 * | | 6/2001 | Lyons et al. ................... 118/726 |
| 6,358,570 B1 * | | 3/2002 | Affinito ........................ 427/495 |
| 7,112,351 B2 | | 9/2006 | Affinito |
| 2004/0009306 A1 * | | 1/2004 | Affinito et al. ................ 427/569 |
| 2005/0126492 A1 * | | 6/2005 | Mikhael et al. ................ 118/726 |
| 2006/0040053 A1 * | | 2/2006 | Gleason et al. ............ 427/248.1 |

FOREIGN PATENT DOCUMENTS

| | | |
|---|---|---|
| GB | 1 521 802 | 8/1978 |
| WO | WO 97/04885 A1 | 2/1997 |
| WO | WO 99/28051 A1 | 6/1999 |
| WO | WO 01/85364 A1 | 11/2001 |

OTHER PUBLICATIONS

Affinito, J.D., et al., "High rate vacuum deposition of polymer electrolytes". J. Vac. Sci. Technol. A 14(3), May/Jun. 1996, pp. 733-738.*
Affinito, John, et al., "Vacuum deposited polymer/metal multilayer films for optical application". Thin Solid Films 270 (1995) pp. 43-48.*
International Search Report and Written Opinion from International Application No. PCT/US2007/024233, dated May 11, 2009.

* cited by examiner

*Primary Examiner* — Bret Chen
(74) *Attorney, Agent, or Firm* — Wolf, Greenfield & Sacks, P.C.

(57) ABSTRACT

Methods for supplying one or more vapors, under reduced pressure, to an environment are provided. The vapor may comprise at least one polymerizable component. In some cases, at least two components may be combined to form the vapor. The components may be provided as separate vapor streams, which may be combined and homogenized. Methods of the invention may also be useful in the deposition of materials on the surface of a substrate. In some cases, the material may form a layer, such as a polymer layer, on the surface of a substrate. The present invention may be useful in applications that require the formation of homogeneous films on the surface of a substrate.

8 Claims, 3 Drawing Sheets

METHODS FOR CO-FLASH EVAPORATION OF POLYMERIZABLE MONOMERS AND NON-POLYMERIZABLE CARRIER SOLVENT/SALT MIXTURES/SOLUTIONS

CROSS-REFERENCE TO RELATED APPLICATION

This application is a Non-Provisional of Provisional (35 USC 119(e)) Application 60/899,735 filed on Feb. 6, 2007.

FIELD OF THE INVENTION

The present invention relates generally to devices and methods for supplying vapors comprising polymerizable monomers using flash evaporation techniques, and, in some cases, depositing the polymerizable monomers on a substrate surface.

BACKGROUND OF THE INVENTION

Many industries require reliable processes for depositing thin coatings of polymeric materials on selected substrates. One means of performing this process is via the vacuum flash evaporation of monomer fluids. A continuous liquid flow of monomer fluid is atomized into a continuous flow of liquid droplets. The droplets are in turn continuously vaporized upon contact with a heated surface that is maintained at a temperature at or above the boiling point for said material, but below the temperature at which said droplets would undergo decomposition and/or polymerization before vaporizing. The vapor may in turn be deposited onto a substrate and subsequently polymerized. This process is detailed in U.S. Pat. No. 4,954,371, incorporated herein by reference.

There is also a related need for polymer composite layers containing ions or salts. Such layers may exhibit a variety of characteristics, such as increased ion conductivity, that may render them superior for specific uses to polymers that consist of polymerized monomer alone. Laminate structures having at least one polymer layer have also been shown to be useful in a wide variety of applications including, but not limited to, electronic devices, such as the formation of anodes for use in electrochemical cells such as Li—S batteries, packaging materials, and solar reflectors.

Initially, those skilled in the art avoided the use of the vacuum flash evaporation method for the formation of polymer composite layers. Conventional wisdom dictated that the temperature required to evaporate salts was too high to permit the inclusion of salts in the evaporation of monomers according to the flash evaporation method. Nevertheless, the use of vacuum flash evaporation method offers certain advantages over other methods of forming polymer layers, including, but not limited to, the ability to create thinner, more uniform polymer layers, a reduction of trapped gas within and/or under the polymer layer, greater density within the polymer layer, and a smoother finished surface.

The inventors of U.S. Pat. No. 5,681,615, incorporated herein by reference, later made the unexpected discovery that, when fully solvated, salts dissolved in monomer solutions may be evaporated along with the monomer according to the vacuum flash evaporation method and thereby used to form composite polymer layers under vacuum. In certain cases, however, particular salts or other substances of interest are not sufficiently soluble in the monomer to allow for flash evaporation. In addition, the technique disclosed in U.S. Pat. No. 5,681,615 patent requires the premixing of the monomer and the salt, thereby making it difficult to tailor the exact composition of the polymer composite layer.

The need therefore exists for an apparatus and method that allow for the creation of polymer composite layers via a flash evaporation process even in cases where the salt or other substance of interest is insufficiently soluble in the monomer of interest to allow for application of the technique disclosed in the '615 patent. The need also exists for an apparatus and method for tailoring more precisely the composition of polymer composite layers.

SUMMARY OF THE INVENTION

The present invention provides methods for supplying a vapor comprising a monomer in a vacuum environment comprising supplying a continuous flow of monomer into a vacuum environment at a temperature below both the decomposition temperature and the polymerization temperature of said monomer; atomizing said flow of monomer into a continuous first flow of liquid droplets; combining a compound with a nonpolymerizable carrier fluid to form a mixture; supplying a continuous flow of said mixture into a vacuum environment at a temperature below the thermal polymerization and/or decomposition temperature of said mixture and its constituent elements; atomizing said flow of mixture into a second continuous flow of liquid droplets; vaporizing, separately, the first flow of liquid droplets and the second flow of liquid droplets to form a first vapor and a second vapor, respectively; combining the first vapor and the second vapor to form a composite vapor comprising the monomer, the compound, and the nonpolymerizable carrier fluid; and continuously vaporizing said composite vapor by causing said composite vapor to contact a heated surface that is maintained at a temperature at or above the boiling point for said composite vapor, or portion thereof, but below the temperature at which said combined vapor, or portion thereof, undergoes thermal polymerization and/or decomposition before vaporizing.

The present invention also provides methods of forming a coating on a surface of a substrate in a vacuum chamber comprising providing in the vacuum chamber an evaporation chamber, wherein the evaporation chamber comprises at least a first vapor and a second vapor, the first vapor comprising a monomer; homogenizing said vapors to form a composite vapor while heating the first vapor and the second vapor at a temperature below that at which thermal polymerization of the monomer is initiated; allowing said composite vapor to flow to the surface of the substrate, the surface maintained at a temperature below the boiling point of the composite vapor, or portion thereof; condensing at least a portion of said composite vapor on the surface of the substrate to form a layer comprising the monomer; and polymerizing said layer to form the coating.

The present invention also provides methods of depositing onto a substrate in a vacuum environment a layer comprising a monomer comprising flash evaporating a monomer by contact with a heated surface under vacuum to form a vapor of said monomer; flash evaporating a mixture of a compound and a carrier fluid by contact with a heated surface under vacuum to form a vapor of said mixture; and condensing the vapor of said monomer and the vapor of the compound in said mixture onto a substrate under vacuum in a vacuum chamber.

The present invention also provides methods for supplying a mixture of polymer precursor components suitable for polymerization, under reduced pressure relative to atmospheric pressure comprising providing a continuous first flow of first liquid droplets comprising a polymerizable species at a temperature below both the decomposition temperature and the polymerization temperature of said species, in a subatmospheric pressure environment; continuously vaporizing the first flow of droplets at a temperature below its thermal polymerization and/or decomposition temperature to form a first vapor; providing a continuous second flow of second liquid droplets comprising a mixture of a second species and a carrier fluid at a temperature below the thermal polymerization and/or decomposition temperature of said second species and fluid; continuously vaporizing the second flow of droplets at a temperature below its thermal polymerization and/or decomposition temperature to form a second vapor; combining the first vapor and the second vapor to form a combined vapor comprising the polymerizable species and the second species; and continuously vaporizing the combined flow of droplets at a temperature below their thermal polymerization and/or decomposition temperature.

The present invention also provides methods of forming a polymer material on a surface of a substrate under reduced pressure relative to atmospheric pressure comprising providing, in a subatmospheric pressure environment, at least two separate vapors in different regions of the environment, some of which comprise different components relative to each other, the vapors collectively comprising polymer precursor components suitable for polymerization, wherein the vapors are maintained, at least prior to the homogenizing step, at a temperature below that at which thermal polymerization and/or decomposition of the precursor components is initiated; homogenizing the vapors to form a composite vapor; condensing at least a subset of the components of the composite vapor on the substrate surface to form, thereon, a polymer precursor substance; and polymerizing the polymer precursor substance to form the polymer material on the substrate surface.

The present invention also relates to devices for supplying a mixture of polymer precursor components suitable for polymerization, under reduced pressure relative to atmospheric pressure comprising an evaporation chamber constructed to receive at least two separate vapors, some of which comprise different components relative to each other, the vapors collectively comprising polymer precursor components suitable for polymerization; and a first vapor inlet and a second vapor inlet, each vapor inlet fluidly connected to the evaporation chamber and constructed to introduce a different vapor into the evaporation chamber, wherein the evaporation chamber is constructed and arranged such that the vapors are maintained at a temperature below that at which thermal polymerization and/or decomposition of the precursor components is initiated.

Figure 1:
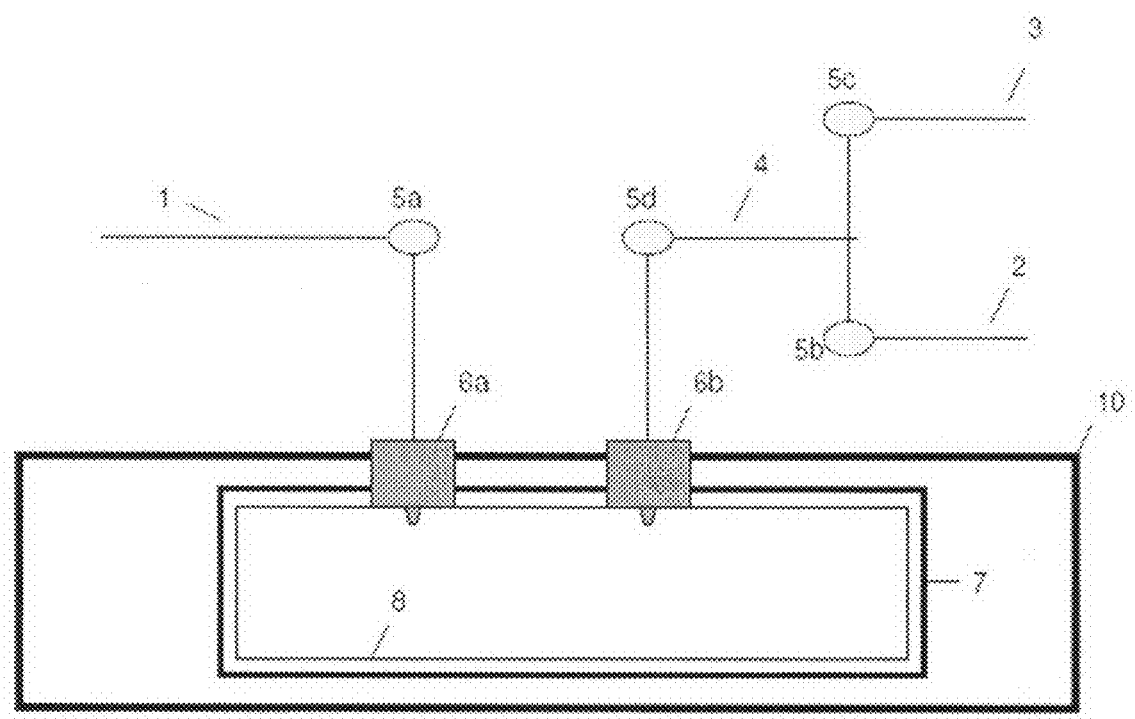
FIG. 1 is a schematic drawing depicting an apparatus used for mixing of separate streams of monomer and a combination of a non-polymerizable carrier fluid and a salt or other compound of interest desired for incorporation into the polymer composite layer.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The present invention relates generally to devices and methods for supplying one or more vapors, under reduced pressure, to an environment. The vapor may comprise at least one polymerizable component. In some cases, at least two components may be combined to form the vapor. The components may be provided separately as streams of liquid droplets, which may be vaporized separately and subsequently combined. Methods of the invention may also be useful in the deposition of materials on the surface of a substrate. In some cases, the material may form a layer, such as a polymer layer, on the surface of a substrate. The present invention may be useful in applications that require the formation of homogeneous films on the surface of a substrate.

The present invention may be particularly advantageous in that materials which are not otherwise soluble with respect to one another may be provided in homogeneous form, such as a vapor. For example, several applications may require the uniform deposition of a mixture of different materials on a surface. The deposition may be performed by vaporization of a homogeneous fluid, e.g., a solution of the component materials, followed by condensation of the vapor on the surface. However, in some cases, a homogeneous fluid may be difficult to obtain due to incompatibility (e.g., insolubility) of the component materials (e.g., immiscibility or limited miscibility of different liquids, insolubility or limited solubility of one or more components of a solution, or a combination). Consequently, only a heterogeneous mixture of the component materials may be available, vaporization of which may not result in uniform vaporization/deposition of each component of the mixture. For example, vaporizing a heterogeneous mixture at a particular temperature may result in vaporization of a first component but polymerization or decomposition of a second component. Heterogeneous mixtures may include, for example, mixtures comprising two, immiscible liquids, or mixtures comprising a solid and a liquid, wherein the solid is insoluble with respect to the liquid. In some cases, heterogeneous mixture may further comprise an additional solvent in which the two materials are not soluble.

Methods of the invention may allow for the formation of a homogeneous vapor comprising at least two components which are substantially insoluble or immiscible with respect to each other in liquid and/or solid form. In some cases, at least two materials may be separately vaporized at two different regions of an apparatus. The vaporized materials may be subsequently combined within the apparatus to form the homogeneous vapor. As used herein, two materials which are "substantially insoluble" with respect to each other are two, immiscible materials which may be combined to form a heterogeneous mixture, such as a suspension. For example, a first component and a second component may be insoluble with respect to one another, such that direct combination of the first component and the second component may not produce a homogeneous mixture for vaporization. However, using the methods described herein, a homogeneous vapor comprising the first component and the second component may be formed by the combination of a first source comprising the first component and a second source comprising the second component. The first component may be provided as a first stream of liquid droplets and the second component may be provided as a second stream of liquid droplets. Flash evaporization of the first and second streams of liquid droplets to form a first vapor and a second vapor, followed by combination of the first and second vapors, may provide the homogenous vapor.

As used herein, a "homogeneous vapor" refers to a vapor comprising at least two, different components, in vapor form, wherein the vapor may be a uniform mixture of the different components. A homogeneous vapor may not be formed simply by the simultaneous introduction of separate vapors into the same enclosure, herein referred to as a "mixture of vapors." However, upon sufficient homogenization (e.g., mixing) of the vapors, a homogeneous vapor may be formed. Homogenization of the mixture of vapors may occur by, for example, continuous vaporization of the mixture of vapors within an apparatus, at a temperature that is above the boiling points of each component of the mixture but below the temperature at which a component of the vapor may decompose or polymerize, and/or flowing the mixture of vapors through an enclosed path in an apparatus, increasing the surface area with which the vapors may collide. The surfaces of the enclosed path may be maintained at a temperature that is above the boiling points of each component of the mixture but below the temperature at which a component of the vapor may decompose or polymerize.

In one embodiment, methods of the invention may be advantageous in cases where it may be desirable to provide a homogeneous vapor comprising a liquid monomer and a material that may otherwise be insoluble with respect to the liquid monomer. For example, a material such as a salt may be insoluble in a liquid monomer, such that combination of the salt and the liquid monomer produces a suspension or other heterogeneous mixture. In some cases, vaporization of the heterogeneous mixture of the salt and the liquid monomer cannot be achieved at a single temperature without undesirable polymerization of the liquid monomer. Using methods as described herein, a homogenous vapor comprising both the salt and the liquid monomer may be obtained, allowing for the simultaneous deposition of both materials on a substrate.

In some embodiments, the present invention provides methods for supplying one or more vapors under reduced pressure relative to atmospheric pressure. Each vapor may be supplied at a different region within an apparatus, such that a mixture of separate vapors may be introduced into an apparatus. In some embodiments, the present invention provides methods for supplying individual streams (e.g., flows) of liquid droplets under reduced pressure relative to atmospheric pressure, wherein at least one flow of liquid droplets comprises one or more polymer precursor components suitable for polymerization. For example, a continuous first flow of first liquid droplets comprising a polymerizable species may be provided at a temperature below both the decomposition temperature and the polymerization temperature of said species, in a subatmospheric pressure environment. A continuous second flow of second liquid droplets may also be provided, wherein the second flow comprises a mixture of a second species and a carrier liquid at a temperature below both the decomposition temperature and the polymerization temperature of said second species and liquid.

For example, the method may comprise supplying a continuous flow of monomer into a vacuum environment at a temperature below both the decomposition temperature and the polymerization temperature of said monomer and atomizing the flow of the monomer into a continuous first flow of liquid droplets. As used herein, the term "atomizing" is given its ordinary meaning in the art and refers to applying an external energy, such as mechanical or acoustical energy, to a material to create liquid droplets which may then be suspended in fluid flow, such as a gas flow. The method may also comprise supplying a continuous flow of a mixture comprising a compound and a carrier fluid into a vacuum environment at a temperature below the decomposition and/or polymerization temperature of said mixture and its constituent elements, and atomizing the flow of the mixture into a second continuous flow of liquid droplets. In some cases, the compound may be a material, such as salt, that may be substantially insoluble with respect to the monomer, and the carrier fluid may be a non-polymerizable carrier fluid.

The first flow of liquid droplets and the second flow of liquid droplets may then be vaporized, separately, and the vapor may be subsequently combined to form a composite vapor comprising the monomer, the compound, and the carrier fluid. The composite vapor may be continuously vaporized by contacting the composite vapor with a heated surface which is maintained at a temperature at or above the boiling points for said composite vapor, or portions thereof, but below the temperature at which said composite vapor, or portions thereof, would undergo decomposition and/or polymerization (e.g., thermal polymerization) before vaporizing. As used herein, the term "vaporize" is given its ordinary meaning in the art and refers to conversion of a material from the liquid phase to the gas or vapor phase, typically by application of heat. Those of ordinary skill in the art would be able to determine the temperature at which a material would undergo decomposition and/or polymerization, based on, for example, the molecular weight and thermal properties of the material. For example, a solution comprising a salt may have a higher decomposition and/or polymerization temperature than a substantially identical solution lacking the salt, under essentially identical conditions. In some cases, mixtures comprising salts can have decomposition and/or polymerization temperatures in the range of 200-300° C. The composite vapor may comprise at least one polymerizable component, i.e., may include a polymerizable composite material. For example, methods described herein may be useful in the formation of polymeric materials by supplying and combining at least two vapors under reduced pressure, wherein the resulting composite vapor comprises at least one polymerizable component. The polymeric material may optionally be deposited on the surface of a substrate as a film or layer, as described more fully below. In some cases, the polymeric material is a salt-containing polymer film.

The present invention also provides methods for depositing a material on a surface of a substrate, in some cases, under reduced pressure relative to atmospheric pressure. In some cases, the material may be deposited as a film or a coating. The material may be a polymeric or a non-polymeric material. In some cases, the material may be deposited as a non-polymeric film, which may be further treated to form a polymeric film. For example, a homogeneous vapor as described herein may be provided and may contact the surface of a substrate, which may be maintained at a temperature that is lower then the boiling point of at least one component of the homogeneous vapor.

In some cases, the method may comprise flash evaporating a polymerizable monomer by contact with a heated surface under vacuum to form a vapor of the monomer, and, likewise, flash evaporating a mixture of a compound (e.g., a salt) and a carrier fluid by contact with a heated surface under vacuum to form a vapor of said mixture. The vapor of the monomer and the vapor of the compound in said mixture, either separately or in combination, may be condensed onto a substrate as a film or layer, under vacuum, in a vacuum chamber. In some cases, the vapor may form a coating on a substrate, such as a polymer coating. For example, the film or layer that is condensed on the substrate may comprise a polymer precursor, wherein the film or layer may be subsequently polymerized to form the polymer material on the substrate surface.

In some cases, the method may comprise providing, in a subatmospheric pressure environment, a mixture of vapors, some of which comprise different components relative to each other, wherein the vapors collectively comprise polymer precursor components suitable for polymerization. The vapors may be maintained at a temperature below that at which thermal polymerization and/or decomposition of the precursor components is initiated, at least prior to the homogenizing step, and, in some cases, through the polymerization step. The vapors may then be homogenized to form a composite vapor, wherein at least a subset of the components of the composite vapor may be condensed on a substrate surface to form, thereon, a film or layer.

For example, the method may comprise use of an evaporation chamber comprising at least a first vapor and a second vapor. In some cases, the first vapor may comprise a monomer and the second vapor may comprise a compound, such as a salt, and a non-polymerizable carrier fluid. The first and second vapors may then be homogenized to form a composite vapor while heating the first vapor and the second vapor at a temperature below that at which thermal polymerization of the monomer is initiated. The composite vapor may then be flowed to the surface of the substrate, which may be maintained at a temperature below the boiling point of the composite vapor, or portion thereof. Condensation of at least a portion of the composite vapor on the surface of the substrate may form a layer comprising the monomer, which may be subsequently polymerized to form a coating. In some embodiments, the present invention provides methods for mixing a non-polymerizable carrier fluid together with one or more salts or other substances desired for incorporation into a polymer composite layer, then flash evaporating the mixture to form a vapor, which may then be combined with one or more types of monomer vapor streams to form a composite mixture. The combined vapor streams can in turn be directed toward a substrate at a temperature lower than that of the flash-evaporation chamber such that the monomer and other material(s) apart from the non-polymerizable carrier fluid condense on said substrate while at least a majority of the carrier fluid remains in vapor form. The layer of condensed material can then be polymerized via one of the many techniques well known to the art. For example, polymerization may comprise exposure to an external source of energy, such as an electric, magnetic, optical, acoustic, electromagnetic, or mechanical field. In some cases, the external source of energy may be an electron beam or "e-beam." In some cases, the external source of energy may be a source of electromagnetic radiation, including visible, ultraviolet, X-ray, and infrared radiation. In one embodiment, the external source of energy comprises ultraviolet radiation.

The present invention relates to systems and methods for the flash evaporation of monomers along with one or more salts and/or other substances that an artisan desires to incorporate into a polymer composite layer. A salt or other substance desired for inclusion in the polymer composite layer may be combined with a non-polymerizable carrier fluid. The mixture is, in turn, directed toward the flash evaporation chamber via a conduit separate from the conduit that directs monomer toward the chamber. The monomer and mixture flows are atomized or otherwise transformed into streams of particles that enter the flash evaporation unit and are vaporized. Vapors may then be directed out of the flash evaporation unit and toward a substrate maintained at a temperature such that the monomer condenses on the substrate along with the other substance(s) desired for incorporation in the polymer composite layer while the carrier fluid remains, at least, primarily in vapor phase. The resultant film on the substrate may be polymerized to afford the desired polymer composite layer.

In some embodiments, a device or apparatus of the invention may comprise an evaporation chamber constructed to receive at least two separate vapors, some of which comprise different components relative to each other, as described herein. The vapors may collectively comprise polymer precursor components suitable for polymerization (e.g., monomers). The device may also comprise a first vapor inlet and a second vapor inlet, each of which is fluidly connected to the evaporation chamber and constructed to introduce a different vapor into the evaporation chamber. As described herein, the evaporation chamber may be constructed and arranged such that the vapors are maintained at a temperature below that at which thermal polymerization and/or decomposition of the precursor components is initiated.

FIG. 1 depicts one arrangement for an apparatus constructed and arranged to supply a vapor of polymerizable composite material in a vacuum environment. Vacuum chamber 10 contains a flash evaporation chamber 7, and is fluidly connected to atomizers 6a and 6b. Feed 1 may be fluidly connected to atomizer 6a, while individual feeds 2 and 3 are combined to form feed 4, which is fluidly connected to atomizer 6b. The rate of flow of feeds 1, 2, 3, and 4 may be adjusted by mechanisms 5a, 5b, 5c, and 5d, respectively. The mechanism may be a valve, adjustable aperture, or any other control mechanism known to the art. The control mechanisms 5a, 5d, 5b and 5c may be in communication with a controller unit that allows for centralized control. Those of ordinary skill in the art would be able to select and/or modify conventional control mechanisms appropriate for use in the context of the invention. The operator may also adjust the respective flow rates independently in order to tailor the composition of the materials flowing toward flash evaporation chamber 7.

In operation, a flow of a first material provided by feed 1 may be streamed toward flash evaporation chamber 7. Separately, a flow of a second material provided by feed 2 may be combined with a continuous flow of material provided by feed 3 to form a mixture, wherein the mixture is streamed toward flash evaporation chamber 7 via feed 4. The mixture may be a solution, a suspension, a colloid, or other combinations of solids and liquids known to the art. In some embodiments, the mixture is a solution. The flow from feed 1 may be introduced to atomizer 6a to form a first flow of liquid droplets in a subatmospheric pressure environment, at a temperature that is below the temperature at which the materials in feed 1 may react (e.g., polymerize) or decompose. Similarly, the flow from feed 4 may be introduced to atomizer 6b to form a second flow of liquid droplets in a subatmospheric pressure environment, at a temperature that is below the temperature at which the materials in feed 4 may react or decompose. The first flow of liquid droplets may then be vaporized and supplied to flash evaporation chamber 7 in vapor form. Separately, the second flow of liquid droplets may be similarly vaporized and supplied to flash evaporation chamber 7 in vapor form. The vapors may be combined upon entry to flash evaporation chamber 7. The droplets may be vaporized by means of techniques well known in the art. Within flash evaporation chamber 7, the vapors may be continuously vaporized via contact with heated surface 8, which may be heated to a temperature above the boiling points of the vapors, but below a temperature that would cause them to react (e.g., polymerize) or decompose.

In an illustrative embodiment, feed 1 may provide a continuous flow of a polymerizable monomer, such as a polymerizable liquid monomer. Feed 2 may provide a solution comprising a compound, such as a salt that is insoluble with respect to the polymerizable monomer, and feed 3 may provide a non-polymerizable carrier fluid 3. The solution comprising the compound and the non-polymerizable carrier are then combined to form a mixture which is introduced to atomizer 6b via feed 4. Feed 1 and feed 4 may then be combined as described herein to form a mixture of liquid droplets comprising the polymerizable monomer, the compound, and the carrier fluid. The liquid droplets may be formed and maintained at a temperature below the decomposition temperatures of the materials and the polymerization temperature of the polymerizable monomer. The mixture may be introduced into the flash evaporation chamber 7, at a temperature below the temperature that would cause decomposition or initiate thermal polymerization. As used herein, the term "non-polymerizable carrier fluid" refers to a substance that does not polymerize to a significant extent when subjected to the temperature and other environmental conditions that facilitate polymerization of the monomer desired for inclusion in the polymer composite layer. The term includes, but is not limited to, substances that do not polymerize under any circumstances.

The composition of the compound/carrier fluid mixture can be tailored by adjusting the relative amounts of compound and carrier fluid. As shown in FIG. 1, this may be accomplished by an in-line mixing process that utilizes mechanisms 5b and 5c to adjust the flow of the carrier liquid and the amount of the compound incorporated thereto. For example, feed 2 may provide a stock solution of the compound in the non-polymerizable carrier, and feed 3 may provide non-polymerizable carrier which may be added to the stock solution as a diluent. Alternatively, the compound/carrier fluid mixture may be prepared separately and then streamed via a single conduit toward the flash evaporation chamber 7, wherein the rate of the flow of the mixture may be adjusted by a similar mechanism.

In some embodiments, a vapor comprising a polymerizable monomer, a salt, and a carrier fluid, formed as described herein, may be further used to form a layer or coating on a substrate. The temperature of evaporation chamber 7 may be maintained such that it is high enough to allow evaporation of the vapors from heated surface 8, but low enough such that the vapors may condense on a desired surface, as described more fully below.

Figure 2A:
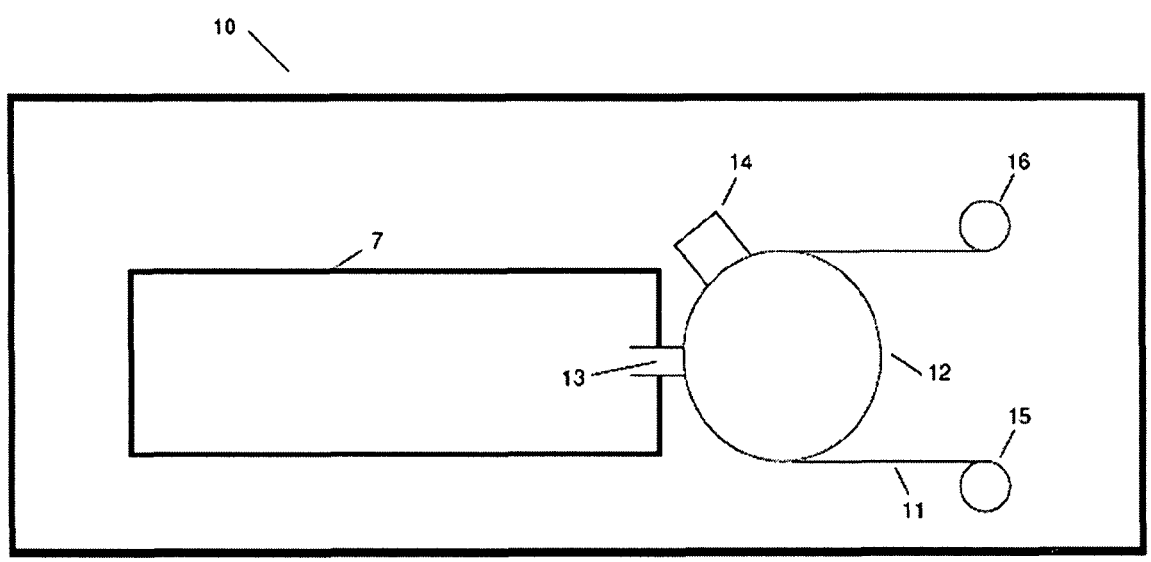
FIG. 2A is a schematic drawing depicting an apparatus used for depositing materials on the surface of a substrate.
Figure 2B:
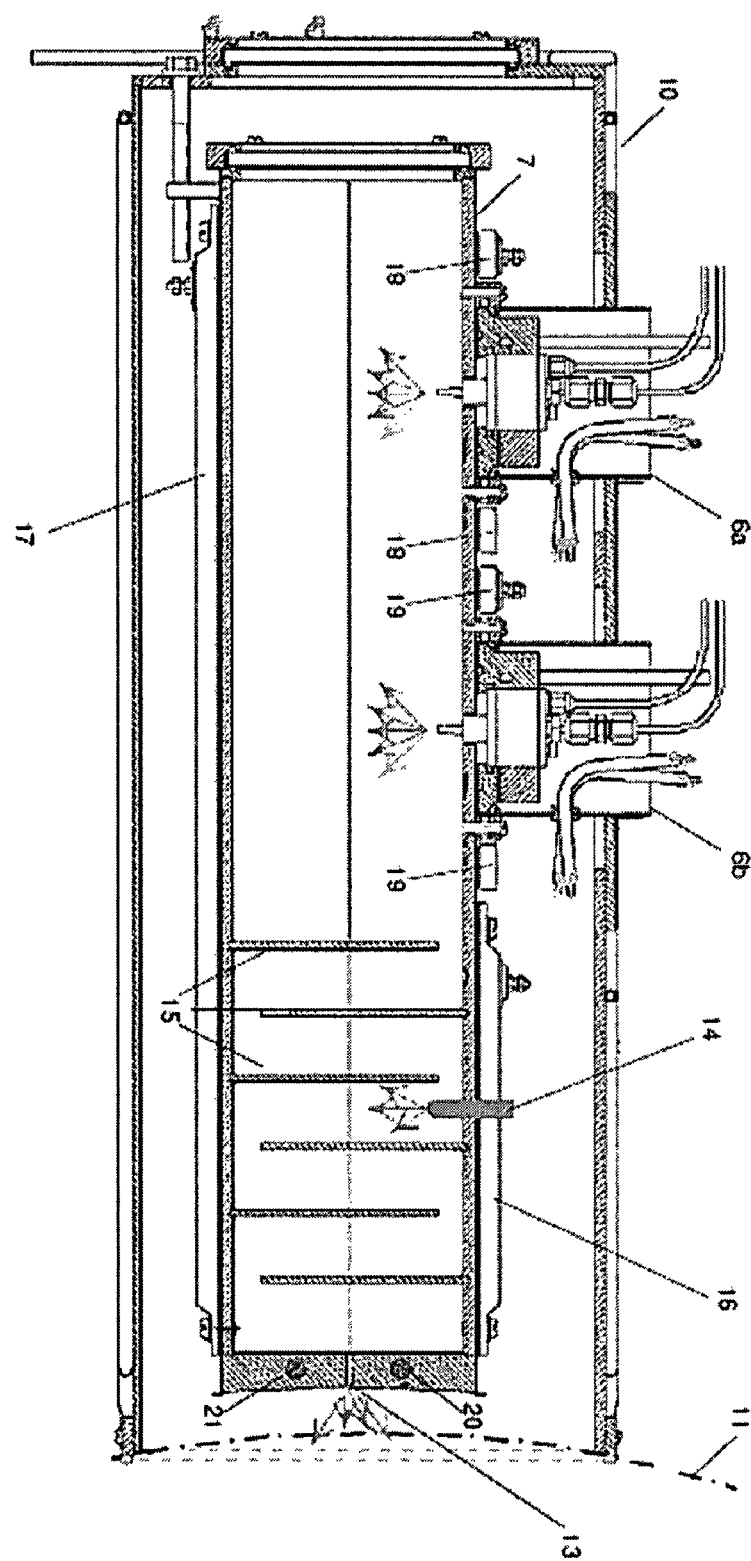
FIG. 2B is another schematic drawing depicting an apparatus used for depositing materials on the surface of a substrate.

FIGS. 2A-B depict embodiments of an apparatus which may direct the vapor out of the flash evaporation unit and into contact with a substrate, wherein the polymerizable monomer may condense onto a surface of the substrate to form a thin film. The vapor may comprise a mixture of a polymerizable monomer and a salt such that the vapor condenses on the substrate as a composite thin film. As shown in FIG. 2A, substrate 11 may be provided from a supply spool 15 and brought into contact with a temperature controlling unit 12 that is capable of regulating the temperature of substrate 11. One example of a temperature controlling unit is disclosed in U.S. Pat. No. 4,842,893, incorporated herein by reference. The substrate may be exposed to the vapor by passing substrate 11 over an aperture 13 of the flash evaporation unit 7, for example, by rotation of temperature controlling unit 12. The temperature of the substrate 11 may be controlled such that a majority of the carrier fluid may be maintained in the vapor phase while the polymerizable monomer condenses with the salt to form a composite thin film on substrate 11. The composite thin film may then be polymerized under vacuum to afford a polymer composite layer. A variety of polymerization techniques may be used, including polymerization by the application of an external source of energy, as described herein. The external source of energy may be provided by source 14. The polymer-coated substrate can in turn be rewound on take-up spool 16.

FIG. 2B shows a side-view illustration of one embodiment of a coating apparatus as described herein. Flash evaporation chamber 7 is positioned within vacuum chamber 10 and is fluidly connected to atomizers 6a and 6b. Upon entry into flash evaporation chamber 7, the vapors may then flow towards aperture 13. A series of baffles 15 are positioned within the chamber to increase the path length of the vapors, generating a large number of collisions between the vapors and the walls of the baffles to produce a more homogeneous vapor. Gas ballast input 14 may be included to flow additional components into flash evaporation chamber 7, if desired.

The temperature of the flash evaporation chamber may be maintained such that the vapor condenses only on the substrate 11, i.e., the interior surfaces of the chamber may be maintained at a specific temperature above the boiling point of the vapor and may not contain "cold spots." As shown in FIG. 2B, the temperature of flash evaporation chamber 7 may be controlled by heater 16, heater 17, and heaters 18 and 19, which enclose atomizers 6a and 6b, respectively. Heating rods 20 and 21 control the temperature within aperture 13. The heaters may be maintained at a temperature higher than the boiling point of the composite vapor, or portions thereof.

Methods of the invention may be used alone or in combination with other known vaporization and/or deposition methods. Additional processing steps may also be used in combination with methods described herein. For example sputtering may be used to deposit layers such as, for example, metals, metal oxides, metal nitrides and ceramics.

As described herein, the method may comprise formation of a polymer film. Polymers, as used herein, refer to extended molecular structures (e.g., oligomers, polymers) comprising a backbone (e.g., non-conjugated backbone, conjugated backbone) which optionally contain pendant side groups, where the term "backbone" refers to the longest continuous bond pathway of the polymer. The polymer may be linear, branched, cross-linked, etc., and can be a homo-polymer or a co-polymer such as a random co-polymer or a block co-polymer. In one embodiment, the polymer is a block co-polymer.

Polymerizable components (e.g., monomers, polymer precursors) suitable for use in the invention include any chemical species capable of undergoing polymerization upon application of, for example, high temperature, electromagnetic radiation, or other polymerization conditions. The monomer may have at least one polymerization site, such as an olefinic group, acrylate group, or other group capable of forming radicals. In some cases, the monomer comprises an acrylate group. For example, the monomer may be a monoacrylate, diacrylate, triacrylate, or other polyacrylate monomer. Generally, the monomer is a liquid. Examples of monomers suitable for use in the methods of the present invention include, but are not limited to, glycol diacrylates, polyglycol diacrylates, polyol polyacrylates, ethoxylated polyol polyacrylates, propoxylated polyol polyacrylates, acrylates with fluorocarbon groups, polyglycol vinyl ethers, polyglycol divinyl ethers, substituted derivatives thereof, combinations thereof, and the like. Suitable glycol diacrylates include, but are not limited to, ethylene glycol diacrylate, 1,3-propanediol diacrylate, 1,4-butanediol diacrylate, 1,3-butylene glycol diacrylate, 1,6-hexanediol diacrylate, and neopentyl glycol diacrylate. Suitable polyglycol diacrylates include, but are not limited to, diethylene glycol diacrylate, triethylene glycol diacrylate, tetraethylene glycol diacrylate, tripropylene glycol diacrylate, polyethylene glycol diacrylates, and polypropylene glycol acrylates. Suitable polyol polyacrylates include, but are not limited to, trimethylol propane triacrylate, pentaerythritol tetraacrylate, and pentaerythritol triacrylate. In some cases, the monomer may be a liquid monomer comprising a glycol diacrylate, polyglycol diacrylate, polyol polyacrylate, combinations thereof, or the like. In some cases, the monomer may be a monoacrylate-substituted version of the monomers listed above, for example, to provide a site for chain termination.

When mixtures of two or more different types of monomers are used, the monomers may be selected to have similar vapor pressures, as detailed in U.S. Pat. No. 7,112,351, incorporated herein by reference.

As described herein, the polymerizable component may be combined with additional components to form a composite vapor. The component may be any material capable of being combined with a carrier fluid and vaporized. In some embodiments, the component comprises a salt. As used herein, the term "salt" is given its ordinary meaning in the art and refers to a neutral, ionic compound comprising a cation and an anion. The salt may be organic or inorganic, and may be a binary salt, complex salt, or the like. In some cases, two or more salts may be used. In some embodiments, the component may be an organic molecule, inorganic molecule, organometallic molecule, polymeric or oligomeric molecules, etc.

Various components of the invention may be combined with a carrier fluid. The carrier fluid may be any fluid having a relatively high vapor pressure such that it may be atomized and/or vaporized as described herein. The carrier fluid may also be selected to be compatible with the salt or other component with which the carrier fluid is to be combined. Compatibility does not necessarily require solubility, and carrier fluids capable of forming a stable suspension, colloid, or other mixture known to the art, with the salt or other component may be sufficiently compatible for use in the invention. Various carrier fluids may be used in the context of the invention, so long as each carrier fluid is sufficiently compatible with the respective component. The carrier fluid may be selected to be non-polymerizable under conditions under which the monomer is polymerizable, as described herein. For example, the method may comprise radical polymerization of acrylate-containing monomers, and the carrier fluid may be selected such that it does not polymerize or otherwise react with the monomers, or other components, under radical polymerization conditions. In an illustrative embodiment, the carrier fluid may not have reactive olefin groups when the method comprises radical polymerization of an acrylate group.

In some cases, a compound such as a salt may be used in methods of the invention. The salt may be any neutral compound comprising a cation and an anion, including inorganic salts and organic salts, or combinations thereof. Examples of salts include, but are not limited to, hydroxides, halides, acetates, nitrates, sulfates, carbonates, phosphates, ammonium salts, etc.

The carrier fluid may also be selected such that, during formation of a film on a substrate as described herein, substantially all of the carrier fluid remains in the vapor phase while various components, such as the monomer, salt, or other substance of interest, is deposited on the substrate. For example, the non-polymerizable carrier fluid may be selected to have a vapor pressure such that, during condensation of at least a portion of the composite vapor on the surface of a substrate, the non-polymerizable carrier fluid substantially does not condense on the surface of the substrate. Factors that may be considered in the selection of the carrier fluid may include the temperature at which the substrate is to be maintained during formation of the film, as well as the difference in the corresponding vapor pressures of monomer and carrier fluid. In some cases, it may be desirable to maximize said difference. The selection of carrier fluid based on vapor pressures is further described in U.S. Pat. No. 7,112,351, incorporated herein by reference.

The carrier fluid (e.g., non-polymerizable carrier fluid) may be any organic or non-organic (e.g., aqueous) fluid. In some cases, the carrier fluid is an organic solvent including polar solvents and non-polar solvents. Examples of some organic solvents include, but are not limited to, hexane, pentane, benzene, toluene, and other hydrocarbons, ethers, dichloromethane, tetrahydrofuran, ethyl methyl ketone, N-methylpyrrolidinone, and the like. In some cases, the carrier fluid is an aqueous solvent or other solvent that is miscible with an aqueous solvent.

In some cases, potential candidates for polymerizable monomers and carrier fluids can be identified by calculating rates of condensation on the cooled substrate. Methods for these calculations are detailed in U.S. Pat. No. 7,112,351, incorporated herein by reference. The rate of condensation may depend on the vapor pressure of the candidate substance at the selected temperature. Tabulations of vapor pressure versus temperature are available in the literature (see for example, T. E. Jordan, *Vapor Pressure of Organic Compounds*, Interscience Publishers Inc., New York). Alternatively, vapor pressure of candidate substances can be measured by methods known in the art.

The capacity of the flash evaporation chamber 7 may be large enough to supply a sufficient amount of monomer vapor to form a film having a desired thickness on the substrate. In some cases, the film may have a thickness from about 0.005 microns to about 10 microns, or from about 0.01 microns to about 1 micron. The film may be deposited at a variety of rates and with small variations in thickness over the film.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed:

1. A method of forming a coating on a surface, comprising:
    providing in a vacuum chamber an evaporation chamber, wherein the evaporation chamber comprises at least a first vapor and a second vapor, the first vapor comprising a monomer and the second vapor comprising a compound and a carrier fluid, wherein, at room temperature and at atmospheric pressure, the compound is substantially insoluble with respect to the monomer;
    homogenizing said vapors to form a composite vapor while heating the first vapor and the second vapor at a temperature below that at which thermal polymerization of the monomer is initiated;
    allowing said composite vapor to flow to the surface of a substrate, the surface maintained at a temperature below the boiling point of the monomer;
    condensing at least a portion of said composite vapor on the surface of the substrate to form a layer comprising the monomer; and
    polymerizing said layer to form the coating.

2. The method of claim 1, wherein the coating is a polymer coating.

3. The method of claim 1, wherein the second vapor comprises a compound and a non-polymerizable carrier fluid.

4. The method of claim 1, wherein the non-polymerizable carrier fluid has a vapor pressure such that, during condensation of at least a portion of said composite vapor on the surface of the substrate, the non-polymerizable carrier fluid substantially does not condense on the surface of the substrate.

5. The method of claim 1, wherein the non-polymerizable carrier fluid is not polymerizable under conditions under which the monomer is polymerizable.

6. The method of claim 1, wherein the polymerizing comprises exposure to an external source of energy.

7. The method of claim 6, wherein the external source of energy is an electric, magnetic, optical, acoustic, electromagnetic, or mechanical field.

8. The method of claim 6, wherein the external source of energy is an electron beam or electromagnetic radiation.

* * * * *